US010170992B1

(12) United States Patent
Omole et al.

(10) Patent No.: US 10,170,992 B1
(45) Date of Patent: Jan. 1, 2019

(54) ADAPTIVE AMPLIFICATION ACTIVE FILTER FOR DIVIDER-LESS HIGH FREQUENCY DC-DC CONVERTERS

(71) Applicant: Dialog Semiconductor (UK) Limited, London (GB)

(72) Inventors: Ibiyemi Omole, Gilbert, AZ (US); James Doyle, Phoenix, AZ (US); Jonathon Stiff, Phoenix, AZ (US); Erik Mentze, Chandler, AZ (US)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/984,669

(22) Filed: May 21, 2018

(51) Int. Cl.
*H02M 3/158* (2006.01)
*H03F 3/45* (2006.01)
*H02M 1/00* (2006.01)

(52) U.S. Cl.
CPC ............ *H02M 3/158* (2013.01); *H02M 1/00* (2013.01); *H03F 3/45475* (2013.01); *H02M 2001/0048* (2013.01); *H03F 2200/129* (2013.01); *H03F 2203/45512* (2013.01); *H03F 2203/45524* (2013.01)

(58) Field of Classification Search
None
See application file for complete search history.

(56) References Cited

U.S. PATENT DOCUMENTS

| 9,035,632 | B2 * | 5/2015 | Futamura | H02M 3/1588 323/282 |
|---|---|---|---|---|
| 2007/0096819 | A1 * | 5/2007 | Yamamoto | H03F 3/303 330/255 |
| 2010/0164622 | A1 * | 7/2010 | Ge | H03F 3/005 330/253 |
| 2012/0146602 | A1 * | 6/2012 | Chen | H02M 3/1582 323/282 |
| 2016/0261260 | A1 * | 9/2016 | Kuo | H03K 5/2481 |

\* cited by examiner

*Primary Examiner* — Jeffrey A Gblende
(74) *Attorney, Agent, or Firm* — Saile Ackerman LLC; Stephen B. Ackerman

(57) ABSTRACT

A circuit and a method for power conversion and for generating an output voltage in accordance with a reference voltage are presented. The power converter has a circuit for filtering the output voltage, an error amplifier circuit that compares the reference voltage and the filtered output voltage for generating an error voltage as a result of the comparison. There is a circuit for driving one or more switching devices in dependence on the error voltage. The error amplifier circuit has a first differential circuit and a first bias current generation circuit for generating a first bias current for the first differential circuit, a second differential circuit and a second bias current generation circuit for generating a second bias current for the second differential circuit, and a circuit for redistributing the first bias current to the second differential circuit or redistributing the second bias current to the first differential circuit.

34 Claims, 10 Drawing Sheets

ADAPTIVE AMPLIFICATION ACTIVE FILTER FOR DIVIDER-LESS HIGH FREQUENCY DC-DC CONVERTERS

TECHNICAL FIELD

This disclosure relates to power converters (e.g., DC-DC converters) and methods of performing power conversion using power converters (e.g., DC-DC converters). This disclosure particularly relates to the application of adaptive amplification techniques for creating adaptive active filter loop compensators that enable wide-range, divider-less, high frequency power converters (such as DC-DC converters, e.g., buck converters). The disclosure is particularly applicable to power converters where wide output regulation range is desired while maintaining stable bandwidth operation and low frequency gain.

BACKGROUND

A large number of conventional techniques for power conversion (e.g., DC-DC power conversion) rely on a converter regulation loop with a feedback factor less than unity to reduce the active filter amplifier input voltage range. However, these techniques achieve the regulation goal at the expense of system costs and a number of disadvantages that include static power loss due to divider static current consumption, decreased efficiency especially at low load/power conditions, increased thermal noise sensitivity due to higher thermal (4KTR) noise, reduced signal fidelity due to reduced signal-to-noise ratio (SNR) stemming from reduced signal level in the presence of increased noise, reduced output voltage accuracy due to divider component leakage, increased number of large passive component count leading to increased silicon area, and possible bandwidth stability issues depending on the chosen divider component values.

On the other hand, loop compensators without feedback division can exhibit challenges of error amplifier (EA) input signal-level correlated gain variation and severe bandwidth degradation posed by using a feedback factor equal to unity. Such loop compensators are subject to large gain variation which complicates loop design and stability and thus are applicable only to scenarios where limited or narrow input range of operation is pertinent.

Also presently there is a burgeoning trend in the field of portable computing power management towards usage of high-speed fully integrated or system-in-package (SiP) voltage regulators/converters to reduce system printed circuit board (PCB) area and system bill of material (BOM) cost as well as establishing fast dynamic voltage scaling (DVS) performance in response to CPU/GPU power saving needs among other factors. However with such practical embedded high-speed multi-phase power converters (e.g., DC-DC converters) having to operate at switching frequencies in the range of high tens to hundreds of megahertz (MHz), the previously neglected aforementioned system costs of using regulation loop dividers start to matter.

SUMMARY

Thus, there is a need for improved power converters (e.g., DC-DC converters) and for improved methods of power conversion using power converters (e.g., DC-DC converters). There is further need for power converters (e.g., DC-DC converters) and corresponding methods that use a feedback factor equal to unity and that can achieve wide-range, fast, efficient and divider-less high-frequency operation without gain programming. In view of some or all of these needs, the present disclosure proposes a power converter and a method of performing power conversion, having the features of the respective independent claims.

An aspect of the disclosure relates to a power converter for performing power conversion and for generating an output voltage in accordance with a reference voltage for the output voltage. The power converter may be a DC-DC converter, for example. The power converter may include a filter circuit for filtering the output voltage of the power converter. The power converter may further include an error amplifier circuit that receives the reference voltage as a first input voltage and receives the filtered output voltage as a second input voltage, for comparing the first input voltage and the second input voltage and for generating an error voltage in accordance with a result of the comparison. The power converter may further include a driver circuit for driving one or more switching devices in dependence on the error voltage. The error amplifier circuit may include a first differential circuit that receives the first input voltage and the second input voltage as inputs and a first bias current generation circuit for generating a first bias current for the first differential circuit. The first differential circuit may be a p-type differential circuit (e.g., p-type differential pair). The error amplifier circuit may further include a second differential circuit that receives the first input voltage and the second input voltage as inputs and a second bias current generation circuit for generating a second bias current for the second differential circuit. The second differential circuit may be an n-type differential circuit (e.g., n-type differential pair). Generating a bias current may refer to sourcing or sinking the bias current. The error amplifier circuit may yet further include a bias current redistribution circuit for redistributing at least part of the first bias current to the second differential circuit or redistributing at least part of the second bias current to the first differential circuit.

Configured as proposed, the error amplifier circuit has a wide input voltage range, wide bandwidth and stable gain over the entire input voltage range to provide large enough gain for low total loop accuracy error while also circumventing system phase margin degradation by avoiding pole(s) introduction within converter loop bandwidth. This is a key element for achieving a constant-gain loop compensator (adaptive active filter) with better degree of freedom on passive component choices for enabling operation of efficient, wide-range, high frequency divider-less power converters (such as DC-DC converters, e.g., buck converters) with fast dynamic voltage scaling response especially in large node CMOS technologies, such as 0.13 µm CMOS or older, for example. Accordingly, the proposed power converter can be divider-less (i.e., have a divider ratio of unity for the feedback voltage).

In some embodiments, the bias current redistribution circuit may be configured to redistribute at least part of the first bias current or at least part of the second bias current such that an input transconductance of the error amplifier circuit is brought closer to a constant input transconductance across an input voltage range of the error amplifier circuit. Thereby, substantially flat input transconductance of the error amplifier circuit from rail to rail can be achieved.

In some embodiments, the filtered output voltage that is received by the error amplifier circuit as the second input voltage may have the same voltage range as the output voltage. The voltage range may be rail-to-rail, e.g., extend from negative rail (e.g., ground rail) to positive rail (e.g., power rail). That is, the output voltage may not be divided by a voltage divider before being supplied to the error amplifier circuit. That is, the power converter may be a divider-less power converter, thereby avoiding divider static current consumption, increasing system efficiency especially at low load/power conditions, decreasing thermal noise sensitivity, increasing signal fidelity due to improved SNR, increasing output voltage accuracy due to the absence of divider component leakage, decreasing the number of large passive component count leading to decreased silicon area, and avoiding possible bandwidth stability issues.

In some embodiments, the bias current redistribution circuit may include a first bypass circuit that is configured to provide a bypass to the first differential circuit and to apply at least part of the first bias current to the second differential circuit. The bias current redistribution circuit may further include a second bypass circuit that is configured to provide a bypass to the second differential circuit and to apply at least part of the second bias current to the first differential circuit. This allows for a simple and efficient implementation of the bias current redistribution circuit.

In some embodiments, the first bypass circuit may operate under control of a first control signal. The second bypass circuit may operate under control of a second control signal. The error amplifier circuit may further include a controller circuit for generating the first control signal for the first bypass circuit and the second control signal for the second bypass circuit. The controller circuit may be referred to as an adaptation controller. The control signals may be threshold voltage dependent references or may depend on the first and/or second input voltages. Thereby, appropriate steering of the bias current to the more suitable differential circuit can be achieved, for maximizing the input transconductance.

In some embodiments, the first differential circuit may include a first p-type field effect transistor (FET). The first differential circuit may further include a second p-type FET. The first input voltage may be applied to a gate terminal of the first p-type FET. The second input voltage may be applied to a gate terminal of the second p-type FET. Further, source terminals of the first and second p-type FETs may be coupled to the first bias current generation circuit. A first differential output signal may be tapped at respective drain terminals of the first and second p-type FETs.

In some embodiments, the first and second p-type FETs may be operated in their sub-threshold region. This can improve adaptation (maximization of input transconductance) and reduce overall current consumption.

In some embodiments, the first bypass circuit may include a third p-type FET. The first bypass circuit may further include a first current mirror for mirroring a current that flows through the third p-type FET. The first control voltage may be applied to a gate terminal of the third p-type FET. A source terminal of the third p-type FET may be coupled to the first bias current generation circuit. The first current mirror may be arranged to apply the mirrored current of the current that flows through the third p-type FET to the second differential circuit (e.g., the first current mirror may be arranged to sink said mirrored current from the second differential circuit). For example, the first current mirror may be arranged to apply the mirrored current of the current that flows through the third p-type FET to source terminals of first and second n-type FETs of the second differential circuit (e.g., the first current mirror may be arranged to sink said mirrored current from the source terminals of the first and second n-type FETs of the second differential circuit).

In some embodiments, the second differential circuit may include a first n-type FET. The second differential circuit may further include a second n-type FET. The first input voltage may be applied to a gate terminal of the first n-type FET. The second input voltage may be applied to a gate terminal of the second n-type FET. Source terminals of the first and second n-type FETs may be coupled to the second bias current generation circuit. A second differential output signal may be tapped at respective drain terminals of the first and second n-type FETs.

In some embodiments, the first and second n-type FETs may be operated in their sub-threshold region. This can improve adaptation (maximization of input transconductance) and reduce overall current consumption.

In some embodiments, the second bypass circuit may include a third n-type FET. The second bypass circuit may further include a second current mirror for mirroring a current that flows through the third n-type FET. The second control voltage may be applied to a gate terminal of the third n-type FET. A source terminal of the third n-type FET may be coupled to the second bias current generation circuit. The second current mirror may be arranged to apply the mirrored current of the current that flows through the third n-type FET to the first differential circuit (e.g., the second current mirror may be arranged to source said mirrored current to the first differential circuit). For example, the second current mirror may be arranged to apply the mirrored current of the current that flows through the third n-type FET to source terminals of the first and second p-type FETs of the first differential circuit (e.g., the second current mirror may be arranged to source said mirrored current to the source terminals of the first and second p-type FETs of the first differential circuit).

In some embodiments, the controller circuit may include a current source. The controller circuit may further include a current sink. The controller circuit may further include a fourth p-type FET that is coupled in series with the current sink between a supply voltage and ground. A gate terminal of the fourth p-type FET may be coupled to a drain terminal of the fourth p-type FET. The controller circuit may yet further include a fourth n-type FET that is coupled in series with the current source between the supply voltage and ground. A gate terminal of the fourth n-type FET may be coupled to a drain terminal of the fourth n-type FET. The first control voltage may be tapped at the gate terminal of the fourth p-type FET. The second control voltage may be tapped at the gate terminal of the fourth n-type FET.

In some embodiments, the controller circuit may be configured to generate the first and second control voltages based on a third input voltage that depends on the first input voltage and/or the second input voltage. Then, the controller circuit may include a current source. The controller circuit may further include a current sink. The controller circuit may further include a fourth p-type FET and a fifth p-type FET that are coupled in series with the current sink between a supply voltage and ground. A gate terminal of the fourth p-type FET may be coupled to a drain terminal of the fifth p-type FET. The controller circuit may yet further include a fourth n-type FET and a fifth n-type FET that are coupled in series with the current source between the supply voltage and ground. A gate terminal of the fourth n-type FET may be coupled to a drain terminal of the fifth n-type FET. The third input voltage may be applied to a gate terminal of the fifth p-type FET and to a gate terminal of the fifth n-type FET. The first control voltage may be tapped at the gate terminal of the fourth p-type FET. The second control voltage may be tapped at the gate terminal of the fourth n-type FET.

In some embodiments, the error amplifier circuit may further include a signal combiner stage for combining a first differential signal that is generated by the first differential circuit and a second differential circuit that is generated by the second differential circuit.

In some embodiments, the filter circuit may include a first parallel circuit comprising two parallel branches with a first resistance in one of the parallel branches and a series connection of a second resistance and a first capacitance in the other one of the parallel branches. The first parallel circuit may be coupled to an input terminal of the error amplifier circuit. The filter circuit may further include a second parallel circuit comprising two parallel branches with a second capacitance in one of the parallel branches and a series connection of a third resistance and a third capacitance in the other one of the parallel branches. The second parallel circuit may be coupled between the input terminal of the error amplifier circuit and an output terminal of the error amplifier circuit.

Another aspect of the disclosure relates to a method of performing power conversion and of generating an output voltage in accordance with a reference voltage for the output voltage. The method may be performed using a power converter. The power converter may be a DC-DC converter, for example. The method may include filtering the output voltage, using a filter circuit. The method may further include comparing the reference voltage as a first input voltage and the filtered output voltage as a second input voltage and generating an error voltage in accordance with a result of the comparison, using an error amplifier circuit. The method may yet further include driving one or more switching devices in dependence on the error voltage. Comparing the first input voltage and the second input voltage and generating the error voltage in accordance with the result of the comparison may include inputting the first input voltage and the second input voltage to a first differential circuit and generating a first bias current for the first differential circuit. Said comparing may further include inputting the first input voltage and the second input voltage to a second differential circuit and generating a second bias current for the second differential circuit. Said comparing may yet further include redistributing at least part of the first bias current to the second differential circuit or redistributing at least part of the second bias current to the first differential circuit.

In some embodiments, redistributing at least part of the first bias current to the second differential circuit or redistributing at least part of the second bias current to the first differential circuit may include redistributing at least part of the first bias current or at least part of the second bias current such that an input transconductance of the error amplifier circuit is brought closer to a constant input transconductance across an input voltage range of the error amplifier circuit.

In some embodiments, the filtered output voltage that is input to the error amplifier circuit as the second input voltage may have the same voltage range as the output voltage. That is, the output voltage may not be divided by a voltage divider before being supplied to the error amplifier circuit.

In some embodiments, redistributing at least part of the first bias current to the second differential circuit or redistributing at least part of the second bias current to the first differential circuit may include providing a bypass to the first differential circuit and applying at least part of the first bias current to the second differential circuit, using a first bypass circuit. Alternatively, said redistributing may include providing a bypass to the second differential circuit and applying at least part of the second bias current to the first differential circuit, using a second bypass circuit. These two modes of providing a bypass may be alternatingly used, depending on circumstances (e.g., depending on the first and second input voltages Vin1, Vin2, or more generally, the input signal level).

In some embodiments, providing the bypass to the first differential circuit may operate under control of a first control signal. Providing the bypass to the second differential circuit may operate under control of a second control signal. Then, the method may further include generating the first control signal and the second control signal, using a controller circuit.

In some embodiments, the first differential circuit may include a first p-type FET. The first differential circuit may further include a second p-type FET. Then, the method may further include applying the first bias current to source terminals of the first and second p-type FETs. The method may further include applying the first input voltage to a gate terminal of the first p-type FET. The method may yet further include applying the second input voltage to a gate terminal of the second p-type FET.

In some embodiments, the method may further include operating the first and second p-type FETs in their sub-threshold region.

In some embodiments, the first bypass circuit may include a third p-type FET. Then, the method may further include applying the first bias current to a source terminal of the third p-type FET. The method may further include applying the first control voltage to a gate terminal of the third p-type FET. The method may further include mirroring a current that flows through the third p-type FET, using a first current mirror. The method may yet further include applying the mirrored current of the current that flows through the third p-type FET to the second differential circuit.

In some embodiments, the second differential circuit may include a first n-type FET. The second differential circuit may further include a second n-type FET. Then, the method may further include applying the second bias current to source terminals of the first and second n-type FETs. The method may further include applying the first input voltage to a gate terminal of the first n-type FET. The method may yet further include applying the second input voltage to a gate terminal of the second n-type FET.

In some embodiments, the method may further include operating the first and second n-type FETs in their sub-threshold region.

In some embodiments, the second bypass circuit may include a third n-type FET. Then, the method may further include applying the second bias current to a source terminal of the third n-type FET. The method may further include applying the second control voltage to a gate terminal of the third n-type FET. The method may further include mirroring a current that flows through the third n-type FET, using a second current mirror. The method may yet further include applying the mirrored current of the current that flows through the third n-type FET to the first differential circuit.

In some embodiments, the controller circuit may include a current source. The controller circuit may further include a current sink. The controller circuit may further include a fourth p-type FET that is coupled in series with the current sink between a supply voltage and ground. A gate terminal of the fourth p-type FET may be coupled to a drain terminal of the fourth p-type FET. The controller circuit may yet further include a fourth n-type FET that is coupled in series with the current source between the supply voltage and ground. A gate terminal of the fourth n-type FET may be coupled to a drain terminal of the fourth n-type FET. Then, the method may further include tapping the first control voltage at the gate terminal of the fourth p-type FET. The method may yet further include tapping the second control voltage at the gate terminal of the fourth n-type FET.

In some embodiments, the controller circuit may be configured to generate the first and second control voltages based on a third input voltage that depends on the first input voltage and/or the second input voltage. That is, the method may include generating the first and second control voltages based on a third input voltage that depends on the first input voltage and/or the second input voltage. Then, the controller circuit may include a current source. The controller circuit may further include a current sink. The controller circuit may further include a fourth p-type FET and a fifth p-type FET that are coupled in series with the current sink between a supply voltage and ground. A gate terminal of the fourth p-type FET may be coupled to a drain terminal of the fifth p-type FET. The controller circuit may yet further include a fourth n-type FET and a fifth n-type FET that are coupled in series with the current source between the supply voltage and ground. A gate terminal of the fourth n-type FET may be coupled to a drain terminal of the fifth n-type FET. The method may further include applying the third input voltage to a gate terminal of the fifth p-type FET and to a gate terminal of the fifth n-type FET. The method may further include tapping the first control voltage at the gate terminal of the fourth p-type FET. The method may yet further include tapping the second control voltage at the gate terminal of the fourth n-type FET.

In some embodiments, the method may further include combining a first differential signal that is generated by the first differential circuit and a second differential circuit that is generated by the second differential circuit.

In some embodiments, the filter circuit may include a first parallel circuit comprising two parallel branches with a first resistance in one of the parallel branches and a series connection of a second resistance and a first capacitance in the other one of the parallel branches. The first parallel circuit may be coupled to an input terminal of the error amplifier circuit. The filter circuit may further include a second parallel circuit comprising two parallel branches with a second capacitance in one of the parallel branches and a series connection of a third resistance and a third capacitance in the other one of the parallel branches. The second parallel circuit may be coupled between the input terminal of the error amplifier circuit and an output terminal of the error amplifier circuit.

Notably, the method may be applied to any of the circuits (power converters, e.g., DC-DC converters) described above, for example as a method of operating these circuits. In addition to steps for operating these circuits, the method may further include steps for providing or arranging any, some, or all of the elements of these circuits and/or steps for coupling or connecting respective elements of these circuits.

Moreover, it will be appreciated that method steps and apparatus features may be interchanged in many ways. In particular, the details of the disclosed method can be implemented as an apparatus adapted to execute some or all or the steps of the method, and vice versa, as the skilled person will appreciate. In particular, it is understood that methods according to the disclosure relate to methods of operating the circuits (power converters, e.g., DC-DC converters) according to the above embodiments and variations thereof, and that respective statements made with regard to the circuits likewise apply to the corresponding methods.

It is also understood that in the present document, the term "couple" or "coupled" refers to elements being in electrical communication with each other, whether directly connected e.g., via wires, or in some other manner (e.g., indirectly). Notably, one example of being coupled is being connected.

BRIEF DESCRIPTION OF THE DRAWINGS

Example embodiments of the disclosure are explained below with reference to the accompanying drawings, wherein like reference numbers indicate like or similar elements, and wherein FIG. 1 schematically illustrates an example of a DC-DC converter, FIG. 2 schematically illustrates an example of a DC-DC converter according to embodiments of the disclosure, FIG. 3 schematically illustrates an example of an error amplifier circuit according to embodiments of the disclosure, FIG. 4A and FIG. 4B schematically illustrate examples of a controller circuit for use in the error amplifier circuit of FIG. 3 according to embodiments of the disclosure, FIG. 5A and FIG. 5B schematically illustrate other examples of a controller circuit for use in the error amplifier circuit of FIG. 3 according to embodiments of the disclosure, FIG. 6 schematically illustrates examples of elements of the error amplifier circuit of FIG. 3 according to embodiments of the disclosure, FIG. 7A and FIG. 7B schematically illustrate further examples of elements of the error amplifier circuit of FIG. 3 according to embodiments of the disclosure, FIG. 8 and FIG. 9 schematically illustrate examples of a signal combiner stage for use in the error amplifier circuit of FIG. 3 according to embodiments of the disclosure.

DESCRIPTION

As indicated above, identical or like reference numbers in the disclosure indicate identical or like elements, and repeated description thereof may be omitted for reasons of conciseness.

In the following description of example embodiments of the disclosure, reference will be made to DC-DC converters as examples of power converters. However, the disclosure is not so limited and shall be construed to be applicable to several kinds of power converters, including switching power converters (switch-mode power converters), such as DC-DC converters (e.g., buck converters). The present disclosure may be further applied to switching AC-DC converters, for example.

Figure 1:
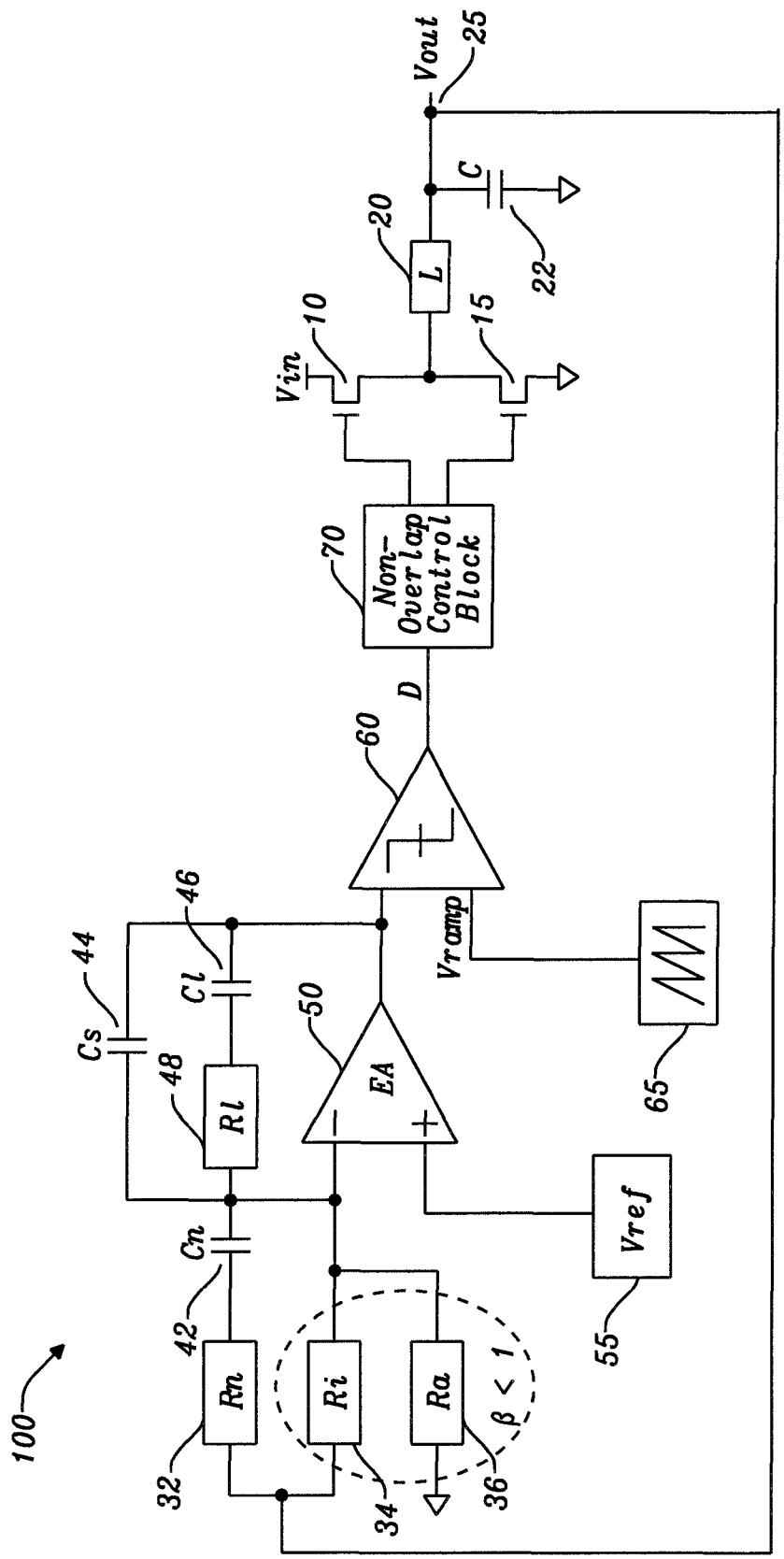

FIG. 1 shows an example of a divider-based DC-DC converter 100, as an example of a power converter to which embodiments of the disclosure are applicable. In the present example, without intended limitation, the DC-DC converter is shown as a DC-DC buck converter. The DC-DC converter 100 performs power conversion and outputs an output voltage Vout in accordance with a reference voltage Vref. To this end, it comprises an error amplifier circuit 50 for comparing an indication of the output voltage Vout to the reference voltage Vref. The aforementioned indication of the output voltage Vout is obtained by dividing the output voltage Vout by a voltage divider and by filtering the voltage-divided output voltage using a filter circuit (e.g., an active loop filter). In the example of FIG. 1, a type-III filter is shown. The filter circuit comprises a first parallel circuit comprising two parallel branches with a first resistance 34 in one of the parallel branches and a series connection of a second resistance 32 and a first capacitance 42 in the other one of the parallel branches. The first parallel circuit is coupled to an input terminal (e.g., the inverting input) of the error amplifier circuit 50. The filter circuit further comprises a second parallel circuit comprising two parallel branches with a second capacitance 44 in one of the parallel branches and a series connection of a third resistance 48 and a third capacitance 46 in the other one of the parallel branches. The second parallel circuit is coupled between the aforementioned input terminal of the error amplifier circuit 50 and an output terminal of the error amplifier circuit 50.

As noted above, the output voltage Vout of the DC-DC converter 100 is divided before being filtered and supplied to the error amplifier circuit 50. To this end, the DC-DC converter 100 comprises a fourth resistance 36 that forms a voltage divider with the first resistance 34. The fourth resistance 36 is coupled to the aforementioned input terminal of the error amplifier circuit 50. Accordingly, the output voltage Vout is divided down by a feedback factor $\beta<1$ that is dictated by the resistance values of the first resistance 34 and the fourth resistance 36.

The error amplifier circuit 50 receives the reference voltage Vref and the filtered output voltage at its inputs and compares these voltages. It further generates an error voltage in accordance with a result of the comparison.

The error voltage generated by the error amplifier circuit 50 is provided to a driver circuit for driving one or more switching devices of the DC-DC converter 100 in dependence on the error voltage. The switching devices may be FETs, for example. The switching devices may include a high-side switch (e.g., high-side FET) 10 and a low-side switch (e.g., low-side FET) 15. The high-side switch 10 and the low-side switch may be coupled in series between an input voltage to the DC-DC converter 100 and ground.

The driver circuit comprises a comparator 60 that receives the error voltage and a ramped voltage (e.g., sawtooth voltage) and generates a drive signal D (e.g., PWM signal) based on a result of the comparison. The ramped voltage may be generated by a ramp generator 65. The drive signal D is then provided to a non-overlap control block 70 that generates the actual gate drive signals for the switching devices in dependence on the drive signal D.

The DC-DC converter 100 further comprises an output filter that is coupled to an intermediate node between the switching devices. The output filter comprises an inductance (e.g., output coil) 20 and a capacitance (e.g., output capacitor) 22 that are coupled in series between the intermediate node and ground. An output node 25 for outputting the output voltage Vout is arranged at an intermediate node between the inductance 20 and capacitance 22 of the output filter.

The reference voltage Vref for the output voltage Vout may be provided by a reference voltage generation unit (block, circuit) 55.

As noted above, relying on a voltage divider for dividing the output voltage Vout before providing it to the error amplifier circuit has a number of shortcomings. The present disclosure seeks to avoid some or all of these shortcomings.

Broadly speaking, the present disclosure presents a scheme for a DC-DC converter system regulation loop with feedback factor of unity used in conjunction with adaptive input transconductance (gm) to achieve fast and efficient divider-less wide output regulation and bandwidth stability for high-frequency multi-phase DC-DC converters (e.g., buck converters).

Thus, DC-DC converters according to embodiments of the disclosure feature—possibly in addition to a DC-DC converter active loop filter, regulation loop feedback, and class AB output for controlled quiescent output current—a wide input range loop compensator (without divider) with input transconductance adaptation. DC-DC converters according to embodiments of the disclosure may further feature a divider-less converter closed loop compensation technique for high frequency operation based on the concept of minimal amplifier compensation for extended bandwidth and low stand-alone open loop stability. Finally, DC-DC converters according to embodiments of the disclosure may feature a fast slewing divider-less loop compensation active filter for fast dynamic voltage scaling (DVS) response.

Using DC-DC converters according to embodiments of the disclosure, significant advantages can be gained for example in the area of Internet of Things (IoT) and portable computing power management DC-DC converter system applications. The present disclosure aids to achieve novel, fast and efficient divider-less wide output regulation and bandwidth stability for embedded, high-speed multi-phase DC-DC converters using smart adaptive error amplification (SM-EA). Likewise, it aids the design of improved loop compensators, using the idea of constant-gain adaptive amplification in switch-mode power supplies (SMPS). This is especially applicable to divider-less buck designs for a variety of applications.

By contrast to conventional techniques, the present disclosure relies on the concept of winner-takes-all (WTA) competition with minimized current mirroring (minimized mirror load ratio) to achieve input transconductance adaptation. Further, the present disclosure does not require individually associated compensation networks for adaptation of the p- and n-type differential pairs of the error amplifier circuit. Yet further, the present disclosure does not rely on input device gate-to-source sensors, but uses a simple analog competition concept.

Figure 2:
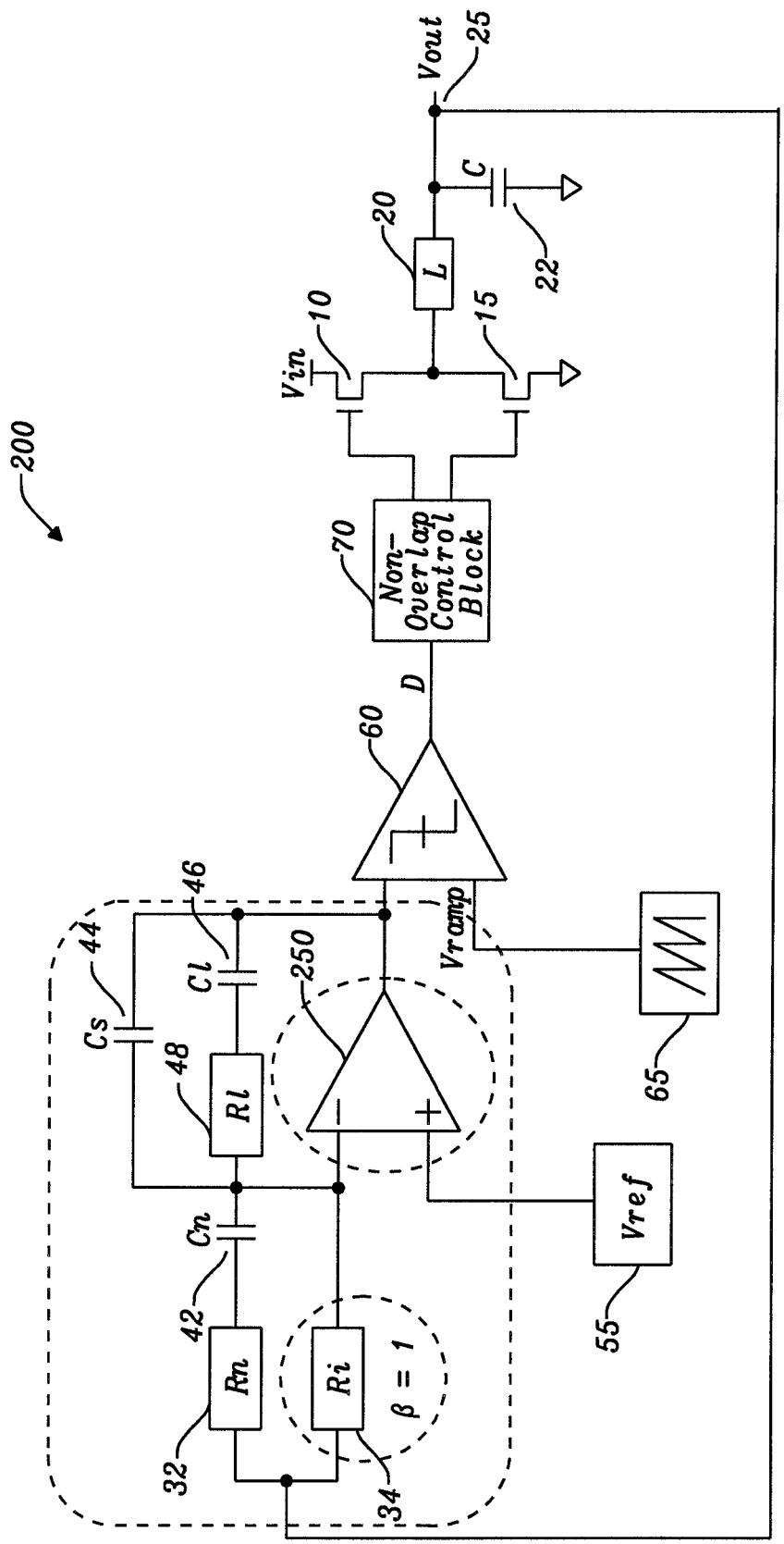

FIG. 2 shows an example of a divider-less DC-DC converter 200 according to embodiments of the disclosure. The DC-DC converter 200 is an example of a power converter according to embodiments of the disclosure, and the disclosure is not to be construed to be limited to DC-DC converters.

The DC-DC converter 200 differs from the DC-DC converter 100 in FIG. 1 in that the fourth resistance 36 is omitted. Accordingly, the output voltage Vout is not divided before being provided to the error amplifier circuit (i.e., the feedback factor $\beta$ is equal to unity). Thus, the DC-DC converter 200 is a divider-less DC-DC converter. Accordingly, the filtered output voltage that is received by the error amplifier circuit as one of its input voltages has the same voltage range as the output voltage Vout. This voltage range may be rail-to-rail, e.g., extend from negative rail to positive rail.

Further, the DC-DC converter 200 differs from the DC-DC converter 100 in that an alternative error amplifier circuit (error amplifier circuit 250) is used instead of the error amplifier circuit 50. The internal configuration of the error amplifier circuit 250 will be described below.

The error amplifier circuit 250 in the divider-less DC-DC converter 200 may be referred to as a "smart adaptive error amplifier." It can be used in the absence of a feedback divider to achieve near-constant input transconductance from rail-to-rail for a regulation loop feedback factor of unity without gain programming. It adaptively adjusts the input transconductance for maximizing gain and bandwidth stability based on the signal input level it senses to provide for stable regulation. Hence, the DC-DC converter 200, even though being divider-less, can provide stable gain over a wide input range. This particularly benefits converters operating at high-frequencies.

Figure 3:
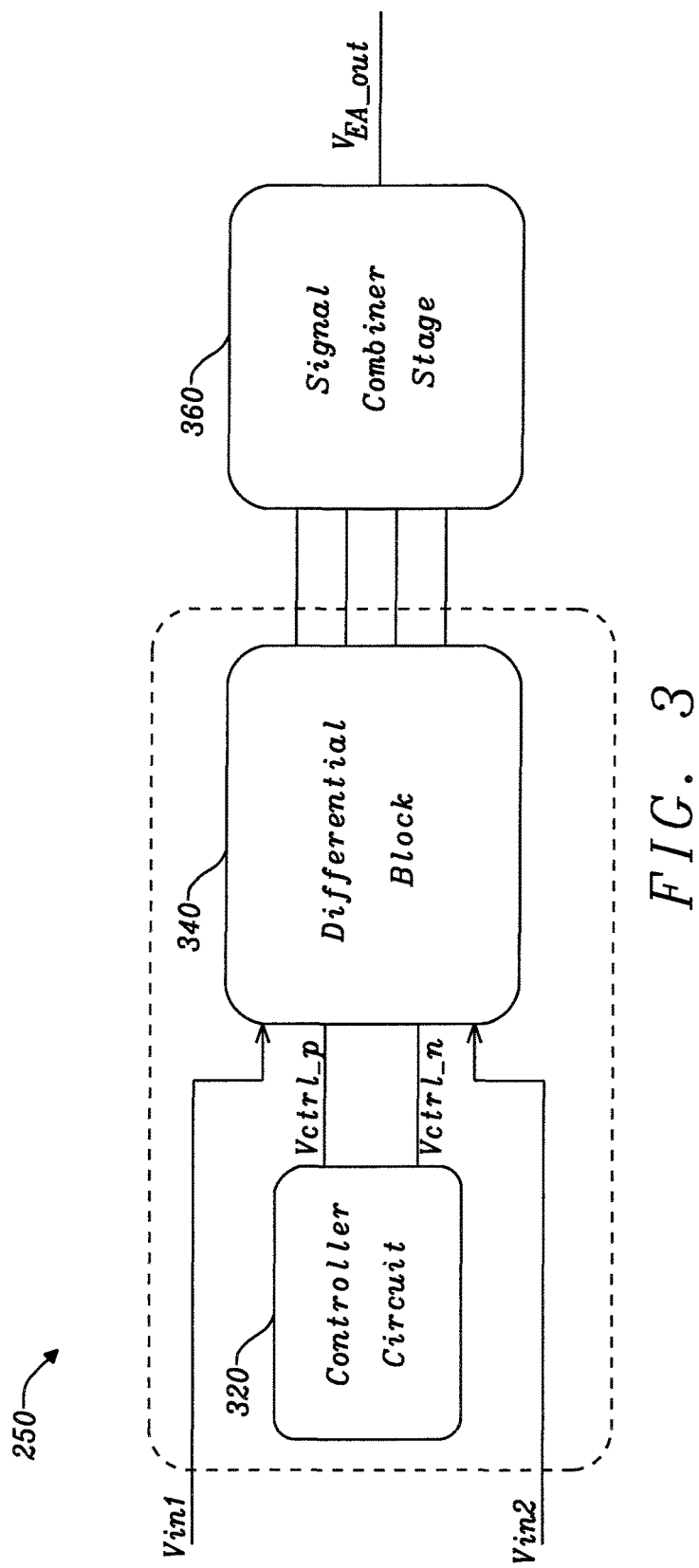

An example of the internal configuration of the error amplifier circuit 250 is schematically illustrated in FIG. 3. The error amplifier circuit 250 receives the reference voltage Vref as a first input voltage Vin1 and receives the filtered output voltage as a second input voltage Vin2. It then compares the first input voltage Vin1 and the second input voltage Vin2 and generates an error voltage $V_{EA\_out}$ in accordance with a result of the comparison.

To this end, the error amplifier circuit 250 comprises a differential block 340, a controller circuit 320, and a signal combiner stage (signal combiner and output stage) 360. The controller circuit 320 and the differential block 340 may be said to implement a complementary Winner-Takes-All (WTA) scheme. The differential block 340 includes complementary differential pairs (p-type and n-type), each with three inputs. It receives the first and second input signals Vin1, Vin2 as inputs, together with first and second control signals Vctrl_p, Vctrl_n. The controller circuit 320 may also be referred to as an adaptation circuit. It generates the first and second control signals Vctrl_p, Vctrl_n for the differential block 340. In particular, it generates a first control signal Vctrl_p for the p-type differential pair and a second control signal Vctrl_n for the n-type differential pair of the differential block 340. The controller circuit 320 may be threshold voltage (Vth) dependent. That is, the first and second control voltages Vctrl_p, Vctrl_n may be threshold voltage dependent. The signal combiner stage 360 receives first and second differential outputs from the differential block 340 and generates an output signal (i.e., the error voltage) $V_{EA\_out}$ based on the first and second differential signals.

Figure 6:
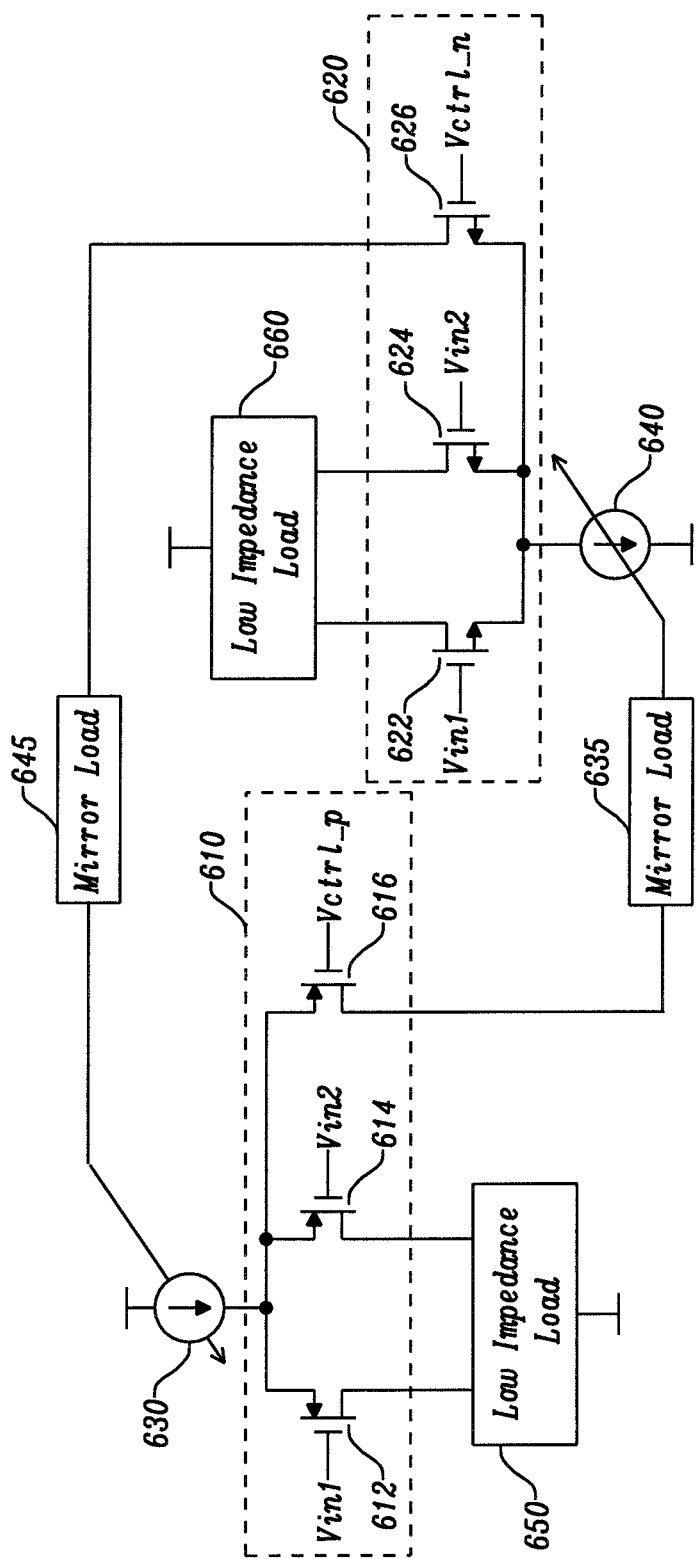

FIG. 6 schematically illustrates an example of the internal configuration of the error amplifier circuit 250. In particular, FIG. 6 may be seen as illustrating an example of the differential block 340. As can be seen from that figure, the error amplifier circuit 250 comprises a first differential circuit 610 and a second differential circuit 620. The first differential circuit 610 is a p-type differential circuit. The second differential circuit 620 is an n-type differential circuit. As will become apparent from the description below, the first and second differential circuits 610, 620 may be referred to as p-type and n-type analog winner-takes-all (WTA) circuits. The first differential circuit 610 receives the first input voltage Vin1 and the second input voltage Vin2 as inputs. Likewise, also the second differential circuit 620 receives the first input voltage Vin1 and the second input voltage Vin2 as inputs. The error amplifier circuit 250 further comprises a first bias current generation circuit (e.g., current source) 630 for generating a first bias current for the first differential circuit 610 and a second bias current generation circuit (e.g., current sink) 640 for generating a second bias current for the second differential circuit 620. Here, generating a bias current may refer to sourcing or sinking the bias current. The error amplifier circuit 250 further comprises a bias current redistribution circuit for, depending on circumstances (e.g., depending on the input signal level), redistributing at least part of the first bias current to the second differential circuit 620 or redistributing at least part of the second bias current to the first differential circuit 610. This bias current redistribution circuit is configured to redistribute at least part of the first bias current or at least part of the second bias current (depending on circumstances) such that an input transconductance of the error amplifier circuit 250 is brought closer to a constant input transconductance across an input voltage range of the error amplifier circuit 250. This input voltage range may be the range from rail to rail.

To this end, the bias current redistribution circuit comprises a first bypass circuit and a second bypass circuit. The first bypass circuit is configured to provide a bypass to the first differential circuit 610 and to apply at least part of the first bias current to the second differential circuit 620 (e.g., sink at least part of the first bias current from the second differential circuit 620). That is, the first bypass circuit can redirect part or all of the first bypass current to the second differential circuit 620. The second bypass circuit is configured to provide a bypass to the second differential circuit 620 and to apply at least part of the second bias current to the first differential circuit 610 (e.g., source at least part of the second bias current to the first differential circuit 610). That is, the second bypass circuit can redirect part or all of the second bypass current to the first differential circuit 610. The first bypass circuit operates under control of the first control signal Vctrl_p. The second bypass circuit operates under control of the second control signal Vctrl_n. Accordingly, the first control signal Vctrl_p may be said to be a control signal for the first bypass circuit and the second control signal Vctrl_n may be said to be a control signal for the second bypass circuit. As indicated above, the control signals may be threshold voltage dependent references. In addition, they may depend on the first and/or second input voltages Vin1, Vin2.

Broadly speaking, the p-type and n-type analog WTA circuits (i.e., the first and second differential circuits 610, 620) of the SM-EA (i.e., error amplifier circuit 250) each comprise three FETs (input FETs) that are biased with adaptable tail current sources (i.e., the bias current generation circuits 630, 640). Each WTA circuit operates with a common tail current source for all three input transistors, where two of the transistors are directly driven by the first and second input voltages Vin1, Vin2 (i.e., the reference voltage Vref and the un-divided (filtered) converter output voltage Vout, via the first resistance 34). The third FET is driven by the threshold voltage dependent controller circuit 320 that generates the first and second control voltages (i.e., Vctrl_p for the p-type WTA circuit and Vctrl_n for the n-type WTA circuit) for local analog competition at the tail node of the WTA circuit that forms the SM-EA input. By so doing, the SM-EA will adapt itself to its sensed inputs and make nearly constant the adapted input transconductance and hence the gain for the rail-to-rail input range.

Returning to FIG. 6, the first differential circuit 610 comprises a first p-type FET 612 and a second p-type FET 614. The first input voltage Vin1 is applied to the gate terminal of the first p-type FET 612. The second input voltage Vin2 is applied to the gate terminal of the second p-type FET 614. The source terminals of the first and second p-type FETs 612, 614 are coupled to the first bias current generation circuit 630. The drain terminals of the first p-type FET 612 and the second p-type FET 614 are coupled to a first low impedance load 650. In some implementations, the first low impedance load 650 may form part of the signal combiner stage 360. A first differential output signal (of the first differential circuit 610) may be tapped at respective drain terminals of the first and second p-type FETs 612, 614.

Analogously, the second differential circuit 620 comprises a first n-type FET 622 and a second n-type FET 624. The first input voltage Vin1 is applied to the gate terminal of the first n-type FET 622. The second input voltage Vin2 is applied to the gate terminal of the second n-type FET 624. The source terminals of the first and second n-type FETs 622, 624 are coupled to the second bias current generation circuit 640. The drain terminals of the first n-type FET 622 and the second n-type FET 624 are coupled to a second low impedance load 660. In some implementations, the second low impedance load 660 may form part of the signal combiner stage 360. A second differential output signal (of the second differential circuit 620) may be tapped at respective drain terminals of the first and second n-type FETs.

The outputs derived from the drain terminals of the first and second differential circuits 610, 620 (WTA circuits) are provided to the signal combiner stage 360 for creating a single-ended output (e.g., the error voltage). For example, the first stage of the signal combiner stage 360 may have a folded-cascode amplifier structure or a folding operational transconductance amplifier (OTA) structure. The output of this first stage then may drive a Class-AB output stage structure to generate the converter loop control voltage (e.g., the error voltage) for pulse-width-modulation (PMW). Example implementations of the signal combiner stage 360 will be described below with reference to FIG. 8 and FIG. 9.

As is also shown in FIG. 6, the first differential circuit 610 comprises a third p-type FET 616. The second differential circuit 620 comprises a third n-type FET 626. The source terminal of the third p-type FET 616 is coupled to the first bias current generation circuit 630 and the source terminal of the third n-type FET 626 is coupled to the second bias current generation circuit 640. The third p-type FET 616 may also be said to form part of the first bypass circuit. The third n-type FET 626 may be said to form part of the second bypass circuit.

Accordingly, the first bypass circuit comprises the third p-type FET 616. Further, the first bypass circuit comprises a first mirror load 635 for mirroring a current that flows through the third p-type FET 616. In this configuration, the first control voltage Vctrl_p is applied to the gate terminal of the third p-type FET 616. The first mirror load 635 is arranged to apply the mirrored current of the current that flows through the third p-type FET 616 to the second differential circuit 620 (e.g., to the source terminals of the first, second, and third n-type FETs 622, 624, 626). The first mirror load 635 may be said to be arranged to sink the mirrored current of the current that flows through the third p-type FET 616 from the second differential circuit 620.

Likewise, the second bypass circuit comprises the third n-type FET 626. Further, the second bypass circuit comprises a second mirror load 645 for mirroring a current that flows through the third n-type FET 626. In this configuration, the second control voltage Vctrl_n is applied to the gate terminal of the third n-type FET 626. The second mirror load 645 is arranged to apply the mirrored current of the current that flows through the third n-type FET 626 to the first differential circuit 610 (e.g., to the source terminals of the first, second, and third p-type FETs 612, 614, 616). The second mirror load 645 may be said to be arranged to source the mirrored current of the current that flows through the third n-type FET 626 to the first differential circuit 610.

Figure 7B:
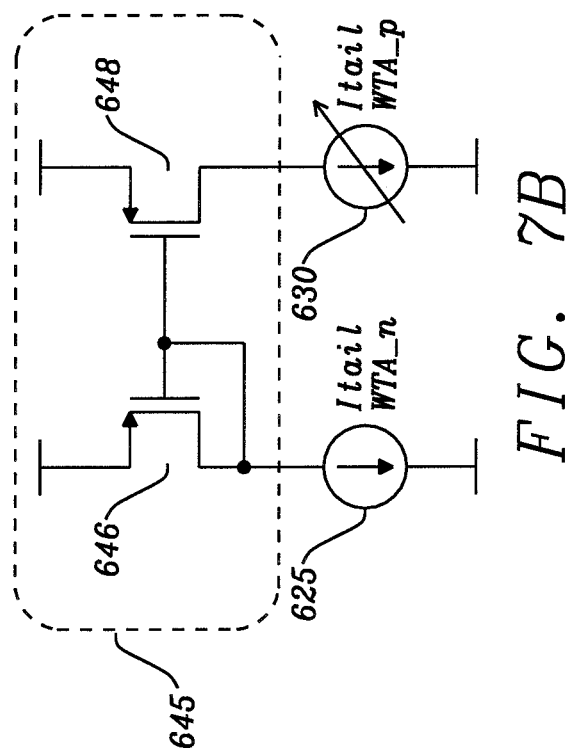
Figure 7A:
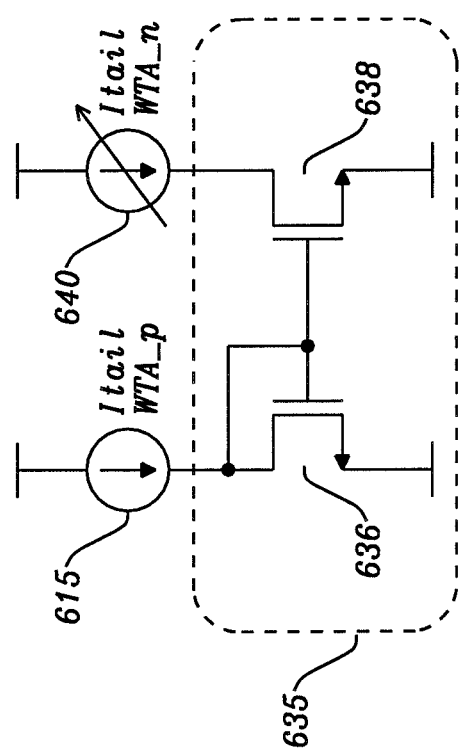

An example of the first mirror load 635 is schematically illustrated in FIG. 7A. An example of the second mirror load 645 is schematically illustrated in FIG. 7B. Therein, the third p-type FET 616 is schematically illustrated as current source 615 that sources the tail current (first bias current) Itail_WTA_p of the first differential circuit 610 (i.e., p-type WTA circuit). The third n-type FET 626 is schematically illustrated as current sink 625 that sinks the tail current (second bias current) Itail_WTA_n of the second differential circuit 620 (i.e., n-type WTA circuit). The first and second bias currents are indicated by Itail_WTA_p and Itail_WTA_n. As can be seen from these figures, the first and second mirror loads 635, 645 may comprise (or correspond to) first and second current mirrors, respectively. The first current mirror (n-type current mirror) comprises two gate-connected n-type FETs 636, 638. The gate terminal of the input-side n-type FET 636 of the first current mirror is coupled to its drain terminal. The second current mirror (p-type current mirror) comprises two gate-connected p-type FETs 646, 648. The gate terminal of the input-side p-type FET 646 of the second current mirror is coupled to its drain terminal.

In some embodiments, the first and second p-type FETs 612, 614 and the first and second n-type FETs 622, 624 are operated in their sub-threshold region. Also the third p-type FET 616 and the third n-type FET 626 may be operated in their sub-threshold region. As has been found, the adaptation (maximization of transconductance) works best for sub-threshold operation of the adaptive error amplifier input differential pairs. While the adaptation would also work for operation in the saturation region, the behavior of the resulting circuitry would not nearly be as linear as for sub-threshold operation.

In other words, in some embodiments the WTA FETs are operated in the sub-threshold region to maximize the achievable transconductance and also to minimize the total current consumption. For operation in the sub-threshold region, mirror ratios of the current mirror of the first and second mirror loads 635, 645 can be chosen to be unity (1:1). Operation in the saturation region is feasible but will require higher than 1:1 mirror load ratio for adaptation and hence higher power consumption for the achievable bandwidth.

Figure 4B:
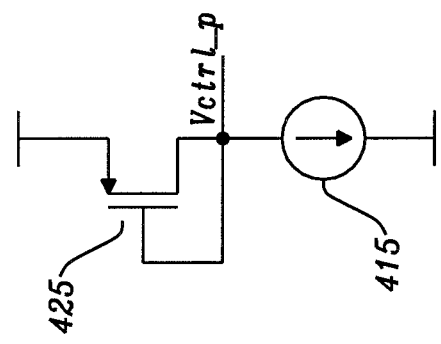
Figure 4A:
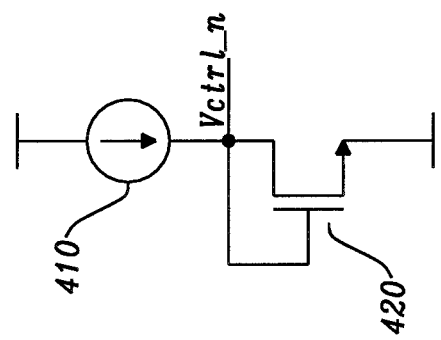

The first and second control signals Vctrl_p, Vctrl_n generated by the controller circuit (adaptation controller) 320 are threshold voltage (Vth) dependent and are used for analog competition at the tail node of the differential pairs that form the input of the differential block 340. The Vth dependent control voltages Vctrl_p and Vctrl_n can be generated by several methods. FIG. 4A and FIG. 4B schematically illustrate first examples of an implementation of the controller circuit 320.

In this first example of an implementation of the controller circuit 320, diode connected p-type and n-type FETs are biased with a steady bias current (type 1). Accordingly, the controller circuit 320 comprises a current source 410, a current sink 415, a fourth p-type FET 425 and a fourth n-type FET 420.

As noted above, the fourth p-type FET 425 is diode connected, i.e., its gate terminal is coupled to its drain terminal. Further, the gate terminal of the fourth n-type FET 420 is coupled to its drain terminal. The fourth p-type FET 425 is coupled in series with the current sink 415 between a supply voltage and ground. Therein, the drain terminal of the fourth p-type FET 425 is coupled to the current sink 415. Further, the fourth n-type FET 420 is coupled in series with the current source 410 between the supply voltage and ground. Therein, the drain terminal of the fourth n-type FET 420 is coupled to the current source 410.

In this configuration, the first control voltage Vctrl_p is tapped at the gate terminal of the fourth p-type FET 425 and the second control voltage Vctrl_n is tapped at the gate terminal of the fourth n-type FET 420.

Another scheme is to allow indirect WTA competition by driving the third FET (non-input driven) of the WTA circuit with one of the controller (type 2) outputs where an input voltage Vin drives a device stacked on the drain of another FET matched to the tail current source transistor in a flipped-voltage-follower (FVF) structure. This structure then forms a Vth dependent driver to adaptively drive the 1:1 mirror load for the tail current of the opposite type WTA bias.

Figures 5A, 5B:
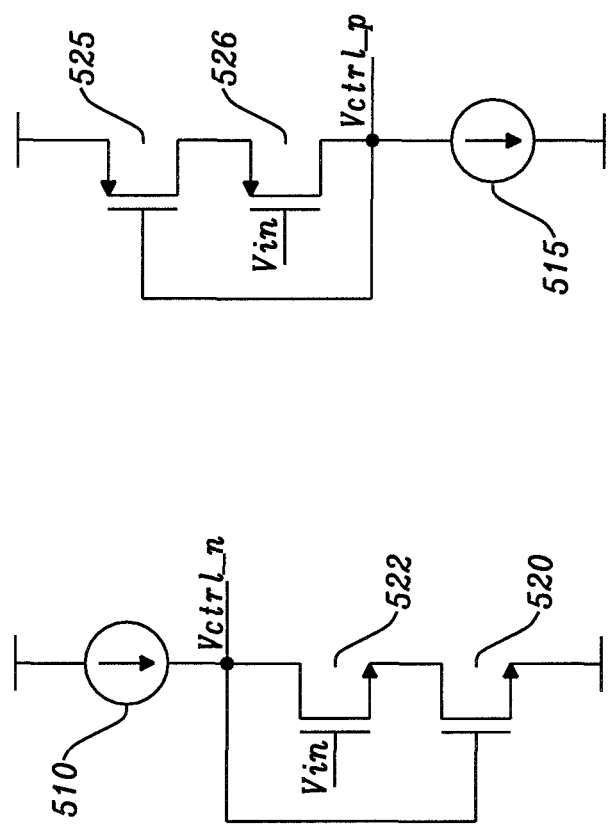

Second examples of an implementation of a controller circuit 320 that operates in accordance with the above scheme is illustrated in FIG. 5A and FIG. 5B. This controller circuit 320 is configured to generate the first and second control voltages Vctrl_p, Vctrl_n based on a (third) input voltage Vin that depends on the first input voltage Vin1 and/or the second input voltage Vin2. For example, the third input voltage Vin may be the reference voltage Vref (i.e., the first input voltage Vin1) or an average of the first and second input voltages Vin1, Vin2.

Now, the controller circuit 320 comprises a current source 510, a current sink 515, a fourth p-type FET 525, a fifth p-type FET 526, a fourth n-type FET 520, and a fifth n-type FET 522. The gate terminal of the fourth p-type FET 525 is coupled to the drain terminal of the fifth p-type FET 526. Similarly, the gate terminal of the fourth n-type FET 520 is coupled to the drain terminal of the fifth n-type FET 522. The fourth p-type FET 525 and the fifth p-type FET 526 are coupled in series with the current sink 515 between the supply voltage and ground. Therein, the source terminal of the fifth p-type FET 526 is coupled to the drain terminal of the fourth p-type FET 525. Further, the drain terminal of the fifth p-type FET 526 is coupled to the current sink 515. Similarly, the fourth n-type FET 520 and the fifth n-type FET 522 are coupled in series with the current source 510 between the supply voltage and ground. Therein, the source terminal of the fifth n-type FET 522 is coupled to the drain terminal of the fourth n-type FET 520. Further, the drain terminal of the fifth n-type FET 522 is coupled to the current source 510.

In this configuration, the third input voltage Vin is applied to the gate terminal of the fifth p-type FET 526 and to the gate terminal of the fifth n-type FET 522. Further, the first control voltage Vctrl_p is tapped at the gate terminal of the fourth p-type FET 525 and the second control voltage Vctrl_n is tapped at the gate terminal of the fourth n-type FET 520.

The error amplifier circuit 250 described above features three distinct modes of operation, depending on the magnitude of the first and second input voltages Vin1, Vin2 in relation to the first and second control voltages Vctrl_p, Vctrl_n (i.e., depending on the input voltage level). For control voltages generated in accordance with embodiments of the disclosure, the first control voltage Vctrl_p is below the positive rail (e.g., power rail, VDD). The second control voltage Vctrl_n is below the first control voltage Vctrl_p and above the negative rail (e.g., ground rail, GND). Then, a first steer mode is active if the first and second input voltages Vin1, Vin2 are between the negative rail and the second control voltage Vctrl_n. In the first steer mode, which is a steer mode via the second control voltage Vctrl_n, only the first differential circuit 610 (p-type differential circuit or p-type differential pair) is active. In this mode, the input transconductance gm of the error amplifier circuit 250 is given by twice the input transconductance gm_p of the first differential circuit 610 (p-type differential pair), i.e., gm=2·gm_p. A second steer mode is active if the first and second input voltages Vin1, Vin2 are between the first control voltage Vctrl_p and the positive rail. In the second steer mode, which is a steer mode via the first control voltage Vctrl_p, only the second differential circuit 620 (n-type differential circuit or n-type differential pair) is active. In this mode, the input transconductance gm of the error amplifier circuit 250 is given by twice the input transconductance gm_n of the second differential circuit 620 (n-type differential pair), i.e., gm=2·gm_n. Finally, a so-called stealth mode is active if the first and second input voltages Vin1, Vin2 are between the first control voltage Vctrl_p and the second control voltage Vctrl_n. In the stealth mode, the first and second bypass circuits, under control of the first and second control voltages Vctrl_p, Vctrl_n, respectively, yield complementary control to both the first and second differential circuits 610, 620. That is, both the first and second differential circuits 610, 620 are active. In this mode, the input transconductance gm of the error amplifier circuit 250 is given by the sum of the input transconductance gm_p of the first differential circuit 610 (p-type differential pair) and the input transconductance gm_n of the second differential circuit 620 (n-type differential pair), i.e., gm=gm_p+gm_n.

As noted above, the error amplifier circuit 250 further comprises the signal combiner stage 360 for combining the first differential signal that is generated by the first differential circuit 610 and the second differential circuit that is generated by the second differential circuit 620. Several implementations of such signal combiner stage 360 are feasible in the context of the present disclosure. Without intended limitation, two examples of implementations of the signal combiner stage are schematically illustrated in FIG. 8 and FIG. 9, respectively.

Figure 8:
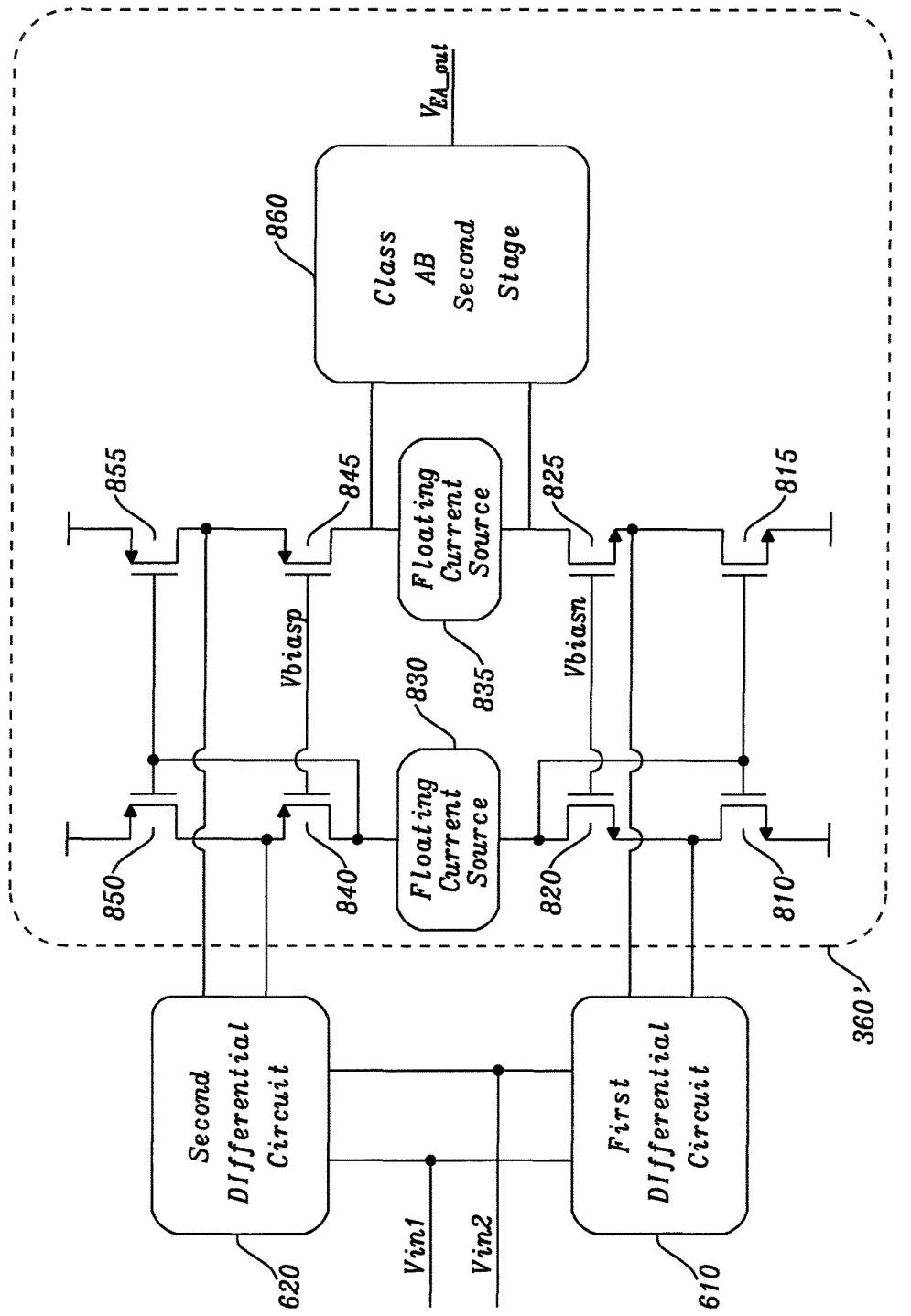
Figure 9:
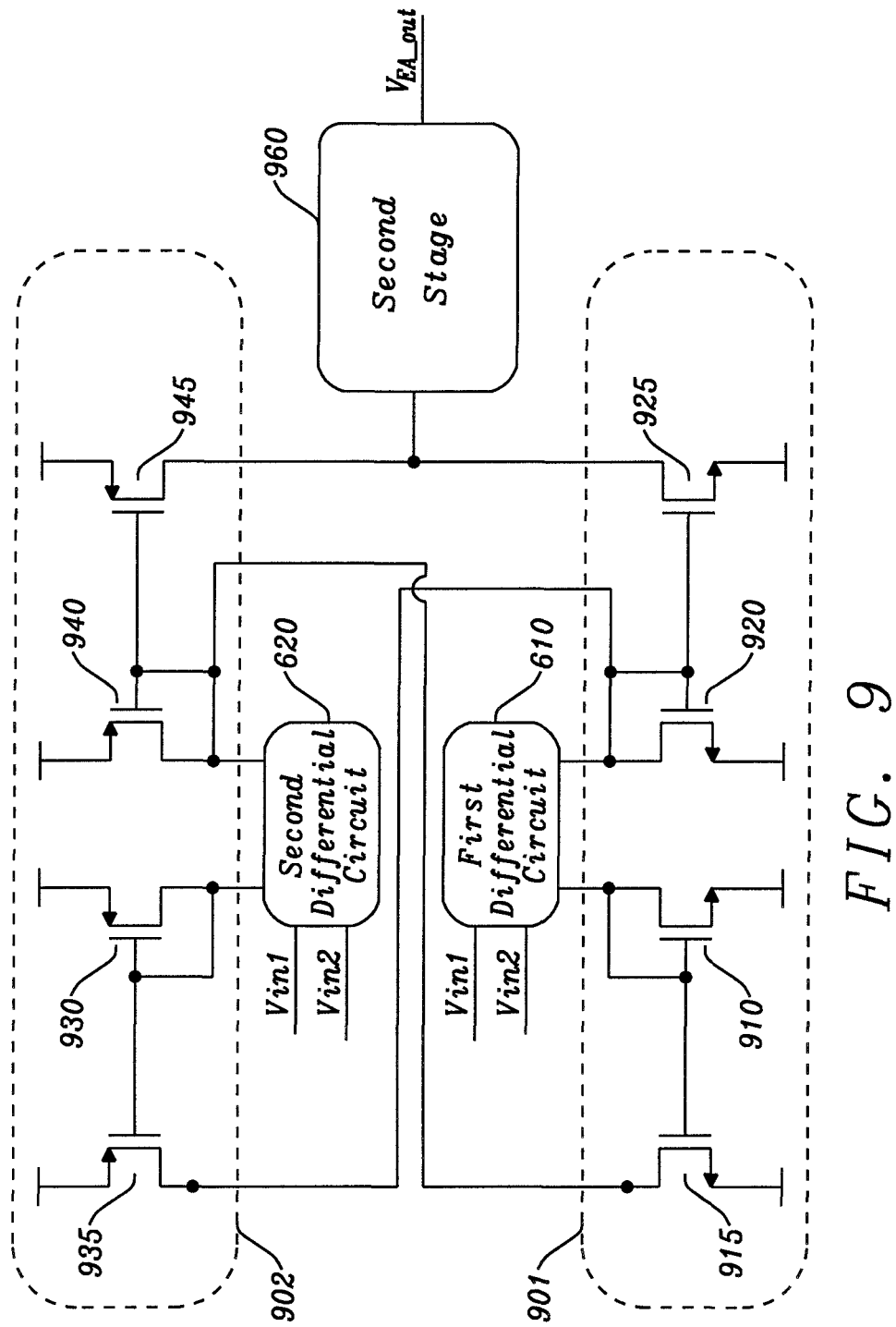

The signal combiner stage in the example of FIG. 8 is of folded cascode type. It comprises p-type FETs 840, 845, 850, 855 that are pairwise gate-connected to form p-type current mirrors. Further, the signal combiner stage comprises n-type FETs 810, 815, 820, 825 that are pairwise gate-connected to form n-type current mirrors. In more detail, the drain terminal of p-type FET 850 is coupled to the source terminal of p-type FET 840. The drain terminal of p-type FET 855 is coupled to the source terminal of p-type FET 845. The gate terminals of p-type FETs 850 and 855 are coupled to each other, and the gate terminals of p-type FETs 840 and 845 are coupled to each other. The voltage at the gate terminals of p-type FETs 840 and 845 is a p-type bias voltage Vbiasp. The gate terminals of p-type FETs 850 and 855 are further coupled to the drain terminal of p-type FET 840. The n-type differential signal (from the second differential circuit 620) is respectively applied to intermediate nodes between p-type FETs 840 and 850, and between p-type FETs 845 and 855.

The drain terminal of n-type FET 810 is coupled to the source terminal of n-type FET 820. The drain terminal of n-type FET 815 is coupled to the source terminal of n-type FET 825. The gate terminals of n-type FETs 820 and 825 are coupled to each other, and the gate terminals of n-type FETs 810 and 815 are coupled to each other. The voltage at the gate terminals of n-type FETs 810 and 815 is a n-type bias voltage Vbiasn. The gate terminals of n-type FETs 810 and 815 are further coupled to the drain terminal of n-type FET 820. The p-type differential signal (from the first differential circuit 610) is respectively applied to intermediate nodes between n-type FETs 810 and 820, and between n-type FETs 815 and 825.

The drain terminal of p-type FET 840 is coupled to the drain terminal of n-type FET 820 via floating current source 830. Further, the drain terminal of p-type FET 845 is coupled to the drain terminal of n-type FET 825 via floating current source 835. Two voltages are tapped at the drain terminal of p-type FET 845 and at the drain terminal of n-type FET 825, respectively, and provided to Class-AB second stage 860. The Class-AB second stage 860 outputs the error amplifier output $V_{EA\_out}$ (e.g., the error voltage).

The signal combiner stage in the example of FIG. 9 is of wrap-around OTA type. It comprises p-type FETs 930, 935, 940, 945 that are pairwise gate-connected to form p-type current mirrors. Further, the signal combiner stage comprises n-type FETs 910, 915, 920, 925 that are pairwise gate-connected to form n-type current mirrors. In more detail, the gate terminals of p-type FETs 930 and 935 are coupled to each other and to the drain terminal of p-type FET 930. The gate terminals of p-type FETs 940 and 945 are coupled to each other and to the drain terminal of p-type FET 940. These gate terminals are further coupled to the drain terminal of n-type FET 915. The gate terminals of n-type FETs 910 and 915 are coupled to each other and to the drain terminal of n-type FET 910. The gate terminals of n-type FETs 920 and 925 are coupled to each other and to the drain terminal of n-type FET 920. These gate terminals are further coupled to the drain terminal of p-type FET 935. The drain terminal of p-type FET 945 is coupled to the drain terminal of n-type FET 925.

The n-type differential signal (from the second differential circuit 620) is respectively applied to the drain terminals of p-type FETs 930 and 940. The p-type differential signal (from the first differential circuit 610) is respectively applied to the drain terminals of n-type FETs 910 and 920. A voltage is tapped at an intermediate node between the drain terminal of p-type FET 945 and the drain terminal of n-type FET 925 and provided to second stage 960. The second stage 960 outputs the error amplifier output $V_{EA\_out}$ (e.g., the error voltage).

Simulation results for the DC-DC converter according to embodiments of the disclosure show a substantially constant rail-to-rail input transconductance. Without adaptation, the input transconductance would significantly drop for input voltages in the vicinity of the positive and negative rails.

In summary, DC-DC converters according to embodiments of the disclosure enable a wide input range (rail-to-rail) without requiring an input divider resistor. The present disclosure can in particular achieve stable wide bandwidth using minimal internal compensation to extend the bandwidth for high-frequency DC-DC converter operation.

DC-DC converters according to embodiments of the disclosure further enable voltage mode operation with type-III compensation and fast DVS even when using older CMOS technology node such as 0.13 μm CMOS or older.

The present disclosure further provides DC-DC converters (e.g., buck converters) with inherently good recovery and good loop gain near both power and ground rails. Due to the adaptive nature of the loop compensator, wide output range capability and lower offset can be achieved since adaptation ensures stable higher loop-gain over a wide signal range. The present disclosure further simplifies attaining an adaptive active filter for loop compensation by relying on inherent competition that exists at the tail-node of common differential pairs.

Passive element values (small values) of the adaptive loop compensator are linearly adjusted using combinations of series and shunt trimmed resistor and capacitor blocks.

Additional advantages of the present disclosure include rail-to-rail input voltage capability for the converter without the need for any divider or divider programming to avoid stability issues, stable adaptation/adjustment of gain over wide input voltage range, maximized input transconductance (gm) with almost full (e.g., 90%) peak-to-peak flatness improvement from rail-to-rail compared to conventional techniques with traditional inputs, inherently good amplification gain near both power and ground rails compared to conventional techniques with traditional inputs, higher converter loop-gain providing lower offset regardless of the input signal levels, extended closed loop converter bandwidth suitable for high frequency operation, and fast dynamic voltage scaling response in conjunction with freedom attained to use smaller loop compensator component values without the constraints of a feedback loop divider.

Figure 10:
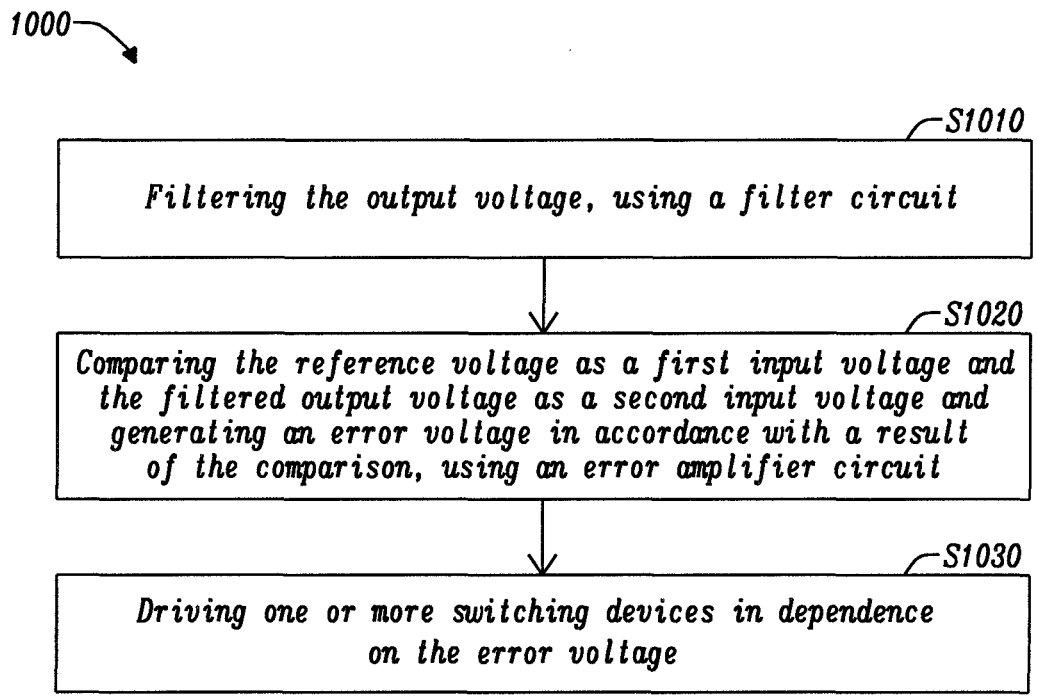
FIG. 10 is a flowchart schematically illustrating a method of performing power conversion using a DC-DC converter according to embodiments of the disclosure.

FIG. 10 is a flowchart schematically illustrating a method 1000 of performing DC-DC conversion and of generating an output voltage in accordance with a reference voltage, e.g., using the DC-DC converter of FIG. 3.

At step S1010, the output voltage is filtered. This step may be performed using the filter circuit described above, for example. At step S1020, the reference voltage as a first input voltage and the filtered output voltage as a second input voltage are compared to each other and an error voltage is generated in accordance with a result of the comparison. This step may be performed using the error amplifier circuit described above, for example. At step S1030, one or more switching devices are driven (controlled) in dependence on the error voltage generated at step S1020.

Figure 11:
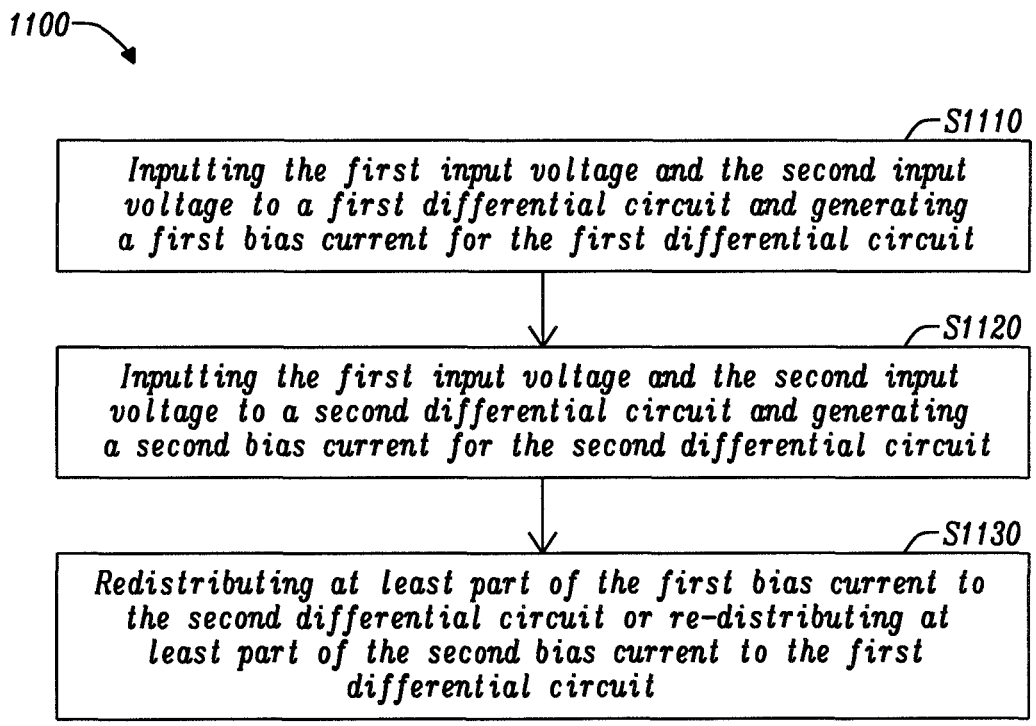
FIG. 11 is a flowchart schematically illustrating a detail of the method of FIG. 10 according to embodiments of the disclosure.

FIG. 11 is a flowchart schematically illustrating a method 1100 of performing step S1020 in the method 1000 of FIG. 10. Accordingly, the flowchart illustrates sub-steps of the above step of comparing the first input voltage and the second input voltage and generating the error voltage in accordance with the result of the comparison.

At step S1110, the first input voltage and the second input voltage are input to a first differential circuit and a first bias current for the first differential circuit is generated. At step S1120, the first input voltage and the second input voltage are input to a second differential circuit and a second bias current for the second differential circuit is generated. At step S1130, at least part of the first bias current is redistributed to the second differential circuit or at least part of the second bias current is redistributed to the first differential circuit.

It should be noted that the description and drawings merely illustrate the principles of the proposed circuits and methods. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed method. Furthermore, all statements herein providing principles, aspects, and embodiments of the invention, as well as specific examples thereof, are intended to encompass equivalents thereof.

What is claimed is:

1. A power converter for performing power conversion and for generating an output voltage in accordance with a reference voltage for the output voltage, the power converter comprising:

a filter circuit for filtering the output voltage of the power converter;

an error amplifier circuit that receives the reference voltage as a first input voltage and receives the filtered output voltage as a second input voltage, for comparing the first input voltage and the second input voltage and for generating an error voltage in accordance with a result of the comparison; and a driver circuit for driving one or more switching devices in dependence on the error voltage;
wherein the error amplifier circuit comprises:
a first differential circuit that receives the first input voltage and the second input voltage as inputs and a first bias current generation circuit for generating a first bias current for the first differential circuit;
a second differential circuit that receives the first input voltage and the second input voltage as inputs and a second bias current generation circuit for generating a second bias current for the second differential circuit; and
a bias current redistribution circuit for redistributing at least part of the first bias current to the second differential circuit or redistributing at least part of the second bias current to the first differential circuit.

2. The power converter according to claim 1, wherein the bias current redistribution circuit is configured to redistribute at least part of the first bias current or at least part of the second bias current such that an input transconductance of the error amplifier circuit is brought closer to a constant input transconductance across an input voltage range of the error amplifier circuit.

3. The power converter according to claim 1, wherein the filtered output voltage that is received by the error amplifier circuit as the second input voltage has the same voltage range as the output voltage.

4. The power converter according to claim 1, wherein the output voltage is not divided by a voltage divider before being supplied to the error amplifier circuit.

5. The power converter according to claim 1, wherein the bias current redistribution circuit comprises:
a first bypass circuit that is configured to provide a bypass to the first differential circuit and to apply at least part of the first bias current to the second differential circuit; and
a second bypass circuit that is configured to provide a bypass to the second differential circuit and to apply at least part of the second bias current to the first differential circuit.

6. The power converter according to claim 5,
wherein the first bypass circuit operates under control of a first control signal;
wherein the second bypass circuit operates under control of a second control signal; and
wherein the error amplifier circuit further comprises a controller circuit for generating the first control signal for the first bypass circuit and the second control signal for the second bypass circuit.

7. The power converter according to claim 1,
wherein the first differential circuit comprises:
a first p-type field effect transistor, FET; and
a second p-type FET;
wherein the first input voltage is applied to a gate terminal of the first p-type FET;
wherein the second input voltage is applied to a gate terminal of the second p-type FET; and
wherein source terminals of the first and second p-type FETs are coupled to the first bias current generation circuit.

8. The power converter according to claim 7, wherein the first and second p-type FETs are operated in their sub-threshold region.

9. The power converter according to claim 6,
wherein the first bypass circuit comprises:
a third p-type field effect transistor, FET; and
a first current mirror for mirroring a current that flows through the third p-type FET;
wherein the first control voltage is applied to a gate terminal of the third p-type FET;
wherein a source terminal of the third p-type FET is coupled to the first bias current generation circuit; and
wherein the first current mirror is arranged to apply the mirrored current of the current that flows through the third p-type FET to the second differential circuit.

10. The power converter according to claim 1,
wherein the second differential circuit comprises:
a first n-type field effect transistor, FET; and
a second n-type FET;
wherein the first input voltage is applied to a gate terminal of the first n-type FET;
wherein the second input voltage is applied to a gate terminal of the second n-type FET; and
wherein source terminals of the first and second n-type FETs are coupled to the second bias current generation circuit.

11. The power converter according to claim 10, wherein the first and second n-type FETs are operated in their sub-threshold region.

12. The power converter according to claim 6,
wherein the second bypass circuit comprises:
a third n-type field effect transistor, FET; and
a second current mirror for mirroring a current that flows through the third n-type FET;
wherein the second control voltage is applied to a gate terminal of the third n-type FET;
wherein a source terminal of the third n-type FET is coupled to the second bias current generation circuit; and
wherein the second current mirror is arranged to apply the mirrored current of the current that flows through the third n-type FET to the first differential circuit.

13. The power converter according to claim 6,
wherein the controller circuit comprises:
a current source;
a current sink;
a fourth p-type field effect transistor, FET, that is coupled in series with the current sink between a supply voltage and ground, wherein a gate terminal of the fourth p-type FET is coupled to a drain terminal of the fourth p-type FET; and
a fourth n-type FET that is coupled in series with the current source between the supply voltage and ground, wherein a gate terminal of the fourth n-type FET is coupled to a drain terminal of the fourth n-type FET; and
wherein the first control voltage is tapped at the gate terminal of the fourth p-type FET and the second control voltage is tapped at the gate terminal of the fourth n-type FET.

14. The power converter according to claim 6, wherein the controller circuit is configured to generate the first and second control voltages based on a third input voltage that depends on the first input voltage and/or the second input voltage.

15. The power converter according to claim 14,
wherein the controller circuit comprises:
a current source;
a current sink;
a fourth p-type field effect transistor, FET, and a fifth p-type FET that are coupled in series with the current sink between a supply voltage and ground, wherein a gate terminal of the fourth p-type FET is coupled to a drain terminal of the fifth p-type FET; and a fourth n-type FET and a fifth n-type FET that are coupled in series with the current source between the supply voltage and ground, wherein a gate terminal of the fourth n-type FET is coupled to a drain terminal of the fifth n-type FET;

wherein the third input voltage is applied to a gate terminal of the fifth p-type FET and to a gate terminal of the fifth n-type FET; and wherein the first control voltage is tapped at the gate terminal of the fourth p-type FET and the second control voltage is tapped at the gate terminal of the fourth n-type FET.

16. The power converter according to claim 1, wherein the error amplifier circuit further comprises a signal combiner stage for combining a first differential signal that is generated by the first differential circuit and a second differential circuit that is generated by the second differential circuit.

17. The power converter according to claim 1, wherein the filter circuit comprises:
a first parallel circuit comprising two parallel branches with a first resistance in one of the parallel branches and a series connection of a second resistance and a first capacitance in the other one of the parallel branches, wherein the first parallel circuit is coupled to an input terminal of the error amplifier circuit; and
a second parallel circuit comprising two parallel branches with a second capacitance in one of the parallel branches and a series connection of a third resistance and a third capacitance in the other one of the parallel branches, wherein the second parallel circuit is coupled between the input terminal of the error amplifier circuit and an output terminal of the error amplifier circuit.

18. A method of performing power conversion and of generating an output voltage in accordance with a reference voltage for the output voltage, using a power converter, the method comprising the steps of:
filtering the output voltage, using a filter circuit;
comparing the reference voltage as a first input voltage and the filtered output voltage as a second input voltage and generating an error voltage in accordance with a result of the comparison, using an error amplifier circuit; and
driving one or more switching devices in dependence on the error voltage;
wherein comparing the first input voltage and the second input voltage and generating the error voltage in accordance with the result of the comparison comprises:
inputting the first input voltage and the second input voltage to a first differential circuit and generating a first bias current for the first differential circuit;
inputting the first input voltage and the second input voltage to a second differential circuit and generating a second bias current for the second differential circuit; and
redistributing at least part of the first bias current to the second differential circuit or redistributing at least part of the second bias current to the first differential circuit.

19. The method according to claim 18, wherein redistributing at least part of the first bias current to the second differential circuit or redistributing at least part of the second bias current to the first differential circuit comprises redistributing at least part of the first bias current or at least part of the second bias current such that an input transconductance of the error amplifier circuit is brought closer to a constant input transconductance across an input voltage range of the error amplifier circuit.

20. The method according to claim 18, wherein the filtered output voltage that is input to the error amplifier circuit as the second input voltage has the same voltage range as the output voltage.

21. The method according to claim 18, wherein the output voltage is not divided by a voltage divider before being supplied to the error amplifier circuit.

22. The method according to claim 18, wherein redistributing at least part of the first bias current to the second differential circuit or redistributing at least part of the second bias current to the first differential circuit comprising the steps of:
providing a bypass to the first differential circuit and applying at least part of the first bias current to the second differential circuit, using a first bypass circuit; or
providing a bypass to the second differential circuit and applying at least part of the second bias current to the first differential circuit, using a second bypass circuit.

23. The method according to claim 22,
wherein providing the bypass to the first differential circuit operates under control of a first control signal;
wherein providing the bypass to the second differential circuit operates under control of a second control signal; and
wherein the method further comprises generating the first control signal and the second control signal, using a controller circuit.

24. The method according to claim 18,
wherein the first differential circuit comprises:
a first p-type field effect transistor, FET; and
a second p-type FET; and
wherein the method further comprises:
applying the first bias current to source terminals of the first and second p-type FETs;
applying the first input voltage to a gate terminal of the first p-type FET; and
applying the second input voltage to a gate terminal of the second p-type FET.

25. The method according to claim 24, further comprising the step of:
operating the first and second p-type FETs in their sub-threshold region.

26. The method according to claim 23,
wherein the first bypass circuit comprises a third p-type field effect transistor, FET; and
wherein the method further comprises the steps of:
applying the first bias current to a source terminal of the third p-type FET;
applying the first control voltage to a gate terminal of the third p-type FET;
mirroring a current that flows through the third p-type FET, using a first current mirror; and
applying the mirrored current of the current that flows through the third p-type FET to the second differential circuit.

27. The method according to claim 18,
wherein the second differential circuit comprises:
a first n-type field effect transistor, FET; and
a second n-type FET; and
wherein the method further comprises:
applying the second bias current to source terminals of the first and second n-type FETs;
applying the first input voltage to a gate terminal of the first n-type FET; and applying the second input voltage to a gate terminal of the second n-type FET.

28. The method according to claim 27, further comprising the step of:
operating the first and second n-type FETs in their sub-threshold region.

29. The method according to claim 23,
wherein the second bypass circuit comprises a third n-type field effect transistor, FET; and
wherein the method further comprises the steps of:
applying the second bias current to a source terminal of the third n-type FET;
applying the second control voltage to a gate terminal of the third n-type FET;
mirroring a current that flows through the third n-type FET, using a second current mirror; and
applying the mirrored current of the current that flows through the third n-type FET to the first differential circuit.

30. The method according to claim 23,
wherein the controller circuit comprises:
a current source;
a current sink;
a fourth p-type field effect transistor, FET, that is coupled in series with the current sink between a supply voltage and ground, wherein a gate terminal of the fourth p-type FET is coupled to a drain terminal of the fourth p-type FET; and
a fourth n-type FET that is coupled in series with the current source between the supply voltage and ground, wherein a gate terminal of the fourth n-type FET is coupled to a drain terminal of the fourth n-type FET; and
wherein the method further comprises tapping the first control voltage at the so gate terminal of the fourth p-type FET and tapping the second control voltage at the gate terminal of the fourth n-type FET.

31. The method according to claim 23, wherein the controller circuit generates the first and second control voltages based on a third input voltage that depends on the first input voltage and/or the second input voltage.

32. The method according to claim 31,
wherein the controller circuit comprises:
a current source;
a current sink;
a fourth p-type field effect transistor, FET, and a fifth p-type FET that are coupled in series with the current sink between a supply voltage and ground, wherein a gate terminal of the fourth p-type FET is coupled to a drain terminal of the fifth p-type FET; and
a fourth n-type FET and a fifth n-type FET that are coupled in series with the current source between the supply voltage and ground, wherein a gate terminal of the fourth n-type FET is coupled to a drain terminal of the fifth n-type FET; and
wherein the method further comprises:
applying the third input voltage to a gate terminal of the fifth p-type FET and to a gate terminal of the fifth n-type FET;
tapping the first control voltage at the gate terminal of the fourth p-type FET and tapping the second control voltage at the gate terminal of the fourth n-type FET.

33. The method according to claim 18, further comprising the step of:
combining a first differential signal that is generated by the first differential circuit and a second differential circuit that is generated by the second differential circuit.

34. The method according to claim 18, wherein the filter circuit comprises:
a first parallel circuit comprising two parallel branches with a first resistance in one of the parallel branches and a series connection of a second resistance and a first capacitance in the other one of the parallel branches, wherein the first parallel circuit is coupled to an input terminal of the error amplifier circuit; and
a second parallel circuit comprising two parallel branches with a second capacitance in one of the parallel branches and a series connection of a third resistance and a third capacitance in the other one of the parallel branches, wherein the second parallel circuit is coupled between the input terminal of the error amplifier circuit and an output terminal of the error amplifier circuit.

* * * * *